(12) United States Patent
Yoshino et al.

(10) Patent No.: US 12,532,768 B2
(45) Date of Patent: Jan. 20, 2026

(54) ELECTRONIC COMPONENT HAVING TERMINAL FORMATION AREA OFFSET FROM MOUNTING SURFACE CENTER AND MANUFACTURING METHOD OF SAME AND OF MOUNTING BOARD

(71) Applicant: TDK CORPORATION, Tokyo (JP)

(72) Inventors: Atsushi Yoshino, Tokyo (JP); Shuichi Takizawa, Tokyo (JP); Yuki Okino, Tokyo (JP); Hiromu Harada, Tokyo (JP)

(73) Assignee: TDK Corporation, Tokyo (JP)

( * ) Notice: Subject to any disclaimer, the term of this patent is extended or adjusted under 35 U.S.C. 154(b) by 679 days.

(21) Appl. No.: 17/687,112

(22) Filed: Mar. 4, 2022

(65) Prior Publication Data

US 2022/0302059 A1   Sep. 22, 2022

(30) Foreign Application Priority Data

Mar. 19, 2021 (JP) .................................. 2021-046033
Mar. 1, 2022 (JP) .................................. 2022-030833

(51) Int. Cl.
*H01L 23/00* (2006.01)
(52) U.S. Cl.
CPC .............. *H01L 24/09* (2013.01); *H01L 24/03* (2013.01); *H01L 24/08* (2013.01); *H01L 2224/03015* (2013.01); *H01L 2224/08145* (2013.01); *H01L 2224/0913* (2013.01)
(58) Field of Classification Search
CPC ... H01L 23/49838; H01L 24/08; H01L 24/09; H01L 2224/03015; H01L 2224/0913; H01L 21/561; H01L 2924/15313; H01L 24/03; H01L 2224/08145; H01L 23/3121; H01L 23/544; H01L 24/96; H01L 23/3107; H05K 3/32; H05K 1/111; G01L 19/148
See application file for complete search history.

(56) References Cited

U.S. PATENT DOCUMENTS

| 6,303,998 | B1 | 10/2001 | Murayama |
| 9,935,079 | B1 * | 4/2018 | Foong ..................... H01L 24/92 |
| 10,070,529 | B2 * | 9/2018 | Fukuzumi .............. H05K 1/181 |

(Continued)

FOREIGN PATENT DOCUMENTS

| JP | 2002-353578 A | 12/2002 |
| JP | 2010-206166 A | 9/2010 |
| WO | WO2010089963 | * 8/2010 |

*Primary Examiner* — Khiem D Nguyen
(74) *Attorney, Agent, or Firm* — Rimon P.C.

(57) ABSTRACT

Disclosed herein is an electronic component that includes a mounting surface having a terminal formation area and a plurality of terminal electrodes arranged in an array in the terminal formation area. The center point of the terminal formation area is offset with respect to the center point of the mounting surface. Thus, at mounting of the electronic component on a mounting substrate, a solder paste is supplied to a land pattern, and then the mounting is performed such that the center point of a mounting area and the center point of the mounting surface coincide with each other, whereby a predetermined displacement occurs between the planar positions of the land pattern and terminal electrode. This allows a void inside the solder to be released outside without involving a layout change of the land pattern.

14 Claims, 11 Drawing Sheets

(56) References Cited

U.S. PATENT DOCUMENTS

| | | | |
|---|---|---|---|
| 2006/0157534 A1 | 7/2006 | Beroz | |
| 2011/0121841 A1* | 5/2011 | Chen | H01L 22/32 |
| | | | 356/399 |
| 2015/0348927 A1* | 12/2015 | Kuo | H01L 24/92 |
| | | | 257/737 |
| 2016/0329257 A1* | 11/2016 | Scanlan | H01L 24/96 |
| 2017/0005058 A1* | 1/2017 | Hurwitz | H01L 23/49822 |
| 2018/0172531 A1* | 6/2018 | Nishiyama | H05K 3/32 |

* cited by examiner

ELECTRONIC COMPONENT HAVING TERMINAL FORMATION AREA OFFSET FROM MOUNTING SURFACE CENTER AND MANUFACTURING METHOD OF SAME AND OF MOUNTING BOARD

BACKGROUND OF THE INVENTION

Field of the Invention

The present invention relates to an electronic component and its manufacturing method and, more particularly, to a surface-mount type electronic component having a plurality of terminal electrodes arranged in an array on a mounting surface and its manufacturing method. The present invention further relates to a manufacturing method for a mounting substrate having such an electronic component mounted thereon.

Description of Related Art

When a surface-mount type electronic component is mounted on a mounting substrate, a solder paste is supplied to a land pattern on the mounting substrate, and the electronic component is mounted on the mounting substrate such that the solder paste and a terminal electrode of the electronic component contact each other, followed by reflow to melt the solder paste. However, when the solder after reflow contains many voids, disadvantages such as a reduction in connection strength, a reduction in heat dissipation, and an increase in an electrical resistance value occur. Such disadvantages are conspicuous particularly when a lead-free solder having low fluidity is used. That is, when the lead-free solder is used, volatile gases or flux residues generated from the solder paste become less likely to be released outside and remain inside the solder, with the result that a void is generated.

To reduce such a void, JP 2010-206166A discloses a method of shifting the land pattern on the mounting substrate by a predetermined angle or in a planar direction with respect to the terminal electrode of the electronic component. This lowers the surface energy of the solder melted through a reflow process, making the void inside the solder more likely to be released outside.

However, since a large number of electronic components are mounted on the mounting substrate, a design change of the land pattern is not feasible.

SUMMARY

It is therefore an object of the present invention to provide a surface-mount type electronic component capable of reducing voids remaining inside the solder without changing the layout of the land pattern and its manufacturing method. Another object of the present invention is to provide a manufacturing method for a mounting substrate having such an electronic component mounted thereon.

An electronic component according to one aspect of the present invention includes: a mounting surface having a terminal formation area; and a plurality of terminal electrodes arranged in an array in the terminal formation area, wherein the center point of the terminal formation area is offset with respect to the center point of the mounting surface.

According to the present invention, at mounting of the electronic component on a mounting substrate, a solder paste is supplied to a land pattern, and then the mounting is performed such that the center point of a mounting area of the mounting substrate and the center point of the mounting surface of the electronic component coincide with each other, whereby a predetermined displacement occurs between the planar positions of the land pattern and terminal electrode. This allows a void inside the solder to be released outside without involving a layout change of the land pattern.

In the present invention, the mounting surface may include a chip surface of a chip main body in which an internal circuit connected to a plurality of the terminal electrodes is formed and a mold surface of a mold member surrounding the chip main body. The mounting surface may have mutually opposing first and second edges, and the width of the mold surface on the mounting surface may vary at the first edge and at the second edge. This allows the center point of the terminal formation area to be offset in one direction without involving a design change of the chip main body.

In this case, the mounting surface may further have mutually opposing third and fourth edges that connect one ends and the other ends of the first and second edges, respectively, and the width of the mold surface on the mounting surface may vary at the third edge and at the fourth edge. This allows the center point of the terminal formation area to be offset obliquely without involving a design change of the chip main body.

An electronic component according to another aspect of the present invention includes: a mounting surface having a terminal formation area; and a plurality of terminal electrodes arranged in an array in the terminal formation area, wherein edges defining the terminal formation area each have a predetermined inclination with respect to each of their corresponding edges of the mounting surface.

According to the present invention, at mounting of the electronic component on a mounting substrate, a solder paste is supplied to a land pattern, and then the mounting is performed such that the center point of a mounting area of the mounting substrate and the center point of the mounting surface of the electronic component coincide with each other, whereby a predetermined displacement occurs between the planar positions of the land pattern and terminal electrode. This allows a void inside the solder to be released outside without involving a layout change of the land pattern.

In the present invention, the mounting surface may include a chip surface of a chip main body in which an internal circuit connected to a plurality of the terminal electrodes is formed and a mold surface of a mold member surrounding the chip main body. The width of the mold surface on the mounting surface may vary along each of edges of the mounting surface. This allows the coordinates of each of a plurality of the terminal electrode to be rotated without involving a design change of the chip main body.

An electronic component manufacturing method according to one aspect of the present invention includes: a first step of fabricating a chip main body having a mounting surface on which a plurality of terminal electrodes are formed; and a second step of covering first and second side surfaces of the chip main body perpendicular to the mounting surface with a mold member, wherein in the second step, the thickness of the mold member is made larger on the side covering the second side surface than on the side covering the first side surface.

According to the present invention, it is possible to easily manufacture an electronic component in which the terminal formation area is offset with respect to the mounting surface.

An electronic component manufacturing method according to another aspect of the present invention includes: a first step of fabricating a chip main body having a mounting surface on which a plurality of terminal electrodes are formed; and a second step of covering side surfaces of the chip main body perpendicular to the mounting surface with a mold member, wherein in the second step, the mold member is formed such that the thickness of the mold member covering the side surfaces vary along edges of the mounting surface.

According to the present invention, it is possible to easily manufacture an electronic component in which the terminal formation area has a rotational displacement with respect to the mounting surface.

A mounting substrate manufacturing method according to the present invention includes a first step of preparing a mounting substrate having a mounting area in which a plurality of land patterns are provided; a second step of, after supplying a solder paste to the plurality of land patterns, mounting the electronic component on the mounting area, and a third step of melting the solder paste by heating, wherein in the second step, the electronic component is mounted such that each of the plurality of land patterns has an area that overlaps its corresponding land pattern and an area that does not overlap the same.

According to the present invention, when the solder paste is melted by heating, the electronic component is self-aligned to cause the solder paste to flow, so that a void is more likely to be released outside during which the solder paste flows.

As described above, according to the present invention, it is possible to reduce voids remaining inside the solder without changing the layout of the land pattern.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

First Embodiment

Figure 1:
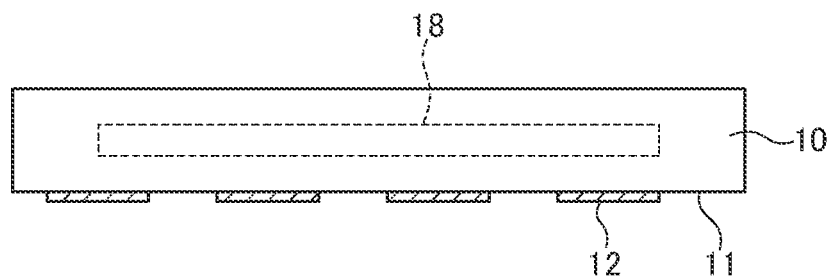
FIG. 1 is a schematic cross-sectional view of an electronic component 1 according to a first embodiment of the present invention.
Figure 2:
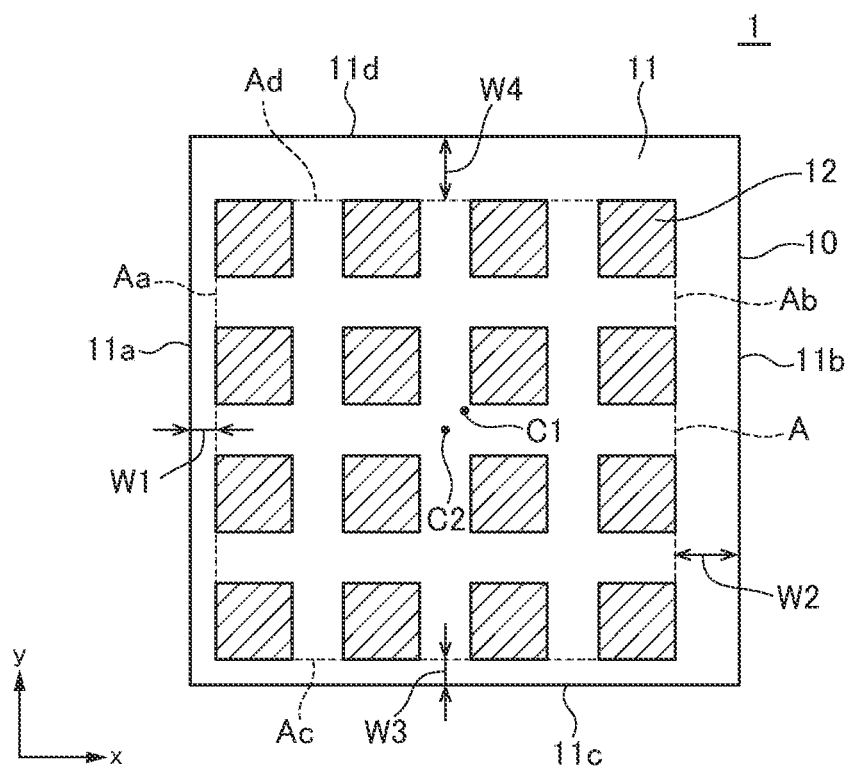
FIG. 2 is a schematic plan view of the electronic component 1 as viewed from a mounting surface side.

FIG. 1 is a schematic cross-sectional view of an electronic component 1 according to a first embodiment of the present invention. FIG. 2 is a schematic plan view of the electronic component 1 as viewed from a mounting surface side.

As illustrated in FIGS. 1 and 2, the electronic component 1 according to the first embodiment has a chip main body 10 and a plurality of terminal electrodes 12 arranged in an array on a mounting surface 11 of the chip main body 10. The chip main body 10 has inside thereof an internal circuit 18 connected to the terminal electrodes 12. The internal circuit 18 is not particularly limited in type.

As illustrated in FIG. 2, a terminal formation area A is defined on the mounting surface 11. The terminal formation area A is an area where the plurality of terminal electrodes 12 are formed and is defined as a rectangular area that surrounds all the terminal electrodes 12.

Although 16 terminal electrodes 12 are provided in the example of FIG. 2, the number of the terminal electrodes 12 is not limited. Further, not all the terminal electrodes 12 need to be aligned in the x- and y-directions, and the terminal formation area A may include a region having no terminal electrode 12. Further, sizes and shaped of all the terminal electrodes 12 are not required to be the same and, for example, some terminal electrodes 12 may be larger in size than others. Furthermore, the planar shape of the terminal electrode 12 is not limited to a quadrangular shape as illustrated in FIG. 2 but may be another shape such as a circular shape.

In the present embodiment, the planar position of the terminal formation area A is offset with respect to the mounting surface 11. That is, the distance between the edge of the terminal formation area A and the edge of the mounting surface 11 is not constant. Here, as illustrated in FIG. 2, the distance between an edge 11a of the mounting surface 11 and an edge Aa of the terminal formation area A is W1. Similarly, the distance between an edge 11b and an edge Ab is W2, the distance between an edge 11c and an edge Ac is W3, and the distance between an edge 11d and an edge Ad is W4. In this case, W1<W2 or W3<W4 is satisfied (W1<W2 and W3<W4 may be satisfied as well). The mutually opposing edges 11a and 11b of the mounting surface 11 and the mutually opposing edges Aa and Ab of the terminal formation area A extend in the y-direction, and the mutually opposing edges 11c and 11d of the mounting surface 11 and the mutually opposing edges Ac and Ad of the terminal formation area A extend in the x-direction. However, one or both of the edges 11a and 11b may have an inclination with respect to the y-direction. Similarly, one or both of the edges 11c and 11d may have an inclination with respect to the x-direction. Thus, the edges 11a, 11b and the edges 11c, 11d need not strictly be perpendicular, and it is sufficient that one end portions of the edges 11a and 11b in the y-direction are connected to each other through the edge 11c and that the other end portions of the edges 11a and 11b in the y-direction are connected to each other through the edge 11d. The distance W1 refers to the distance between the edge 11a of the mounting surface 11 and the edge Aa of the terminal formation area A in the x-direction. Similarly, the distance W2 refers to the distance between the edge 11b and the edge Ab in the x-direction, the distance W3 refers to the distance between the edge 11c and the edge Ac in the y-direction, and the distance W4 refers to the distance between the edge 11d and the edge Ad in the x-direction.

With this configuration, a center point C1 of the mounting surface 11 and a center point C2 of the terminal formation area A do not coincide with each other, and the planar positions thereof are offset with respect to each other. In the example of FIG. 2, the center point C2 of the terminal formation area A is offset obliquely downward to the left (negative x- and negative y-directions) with respect to the center point C1 of the mounting surface 11.

Figure 3:
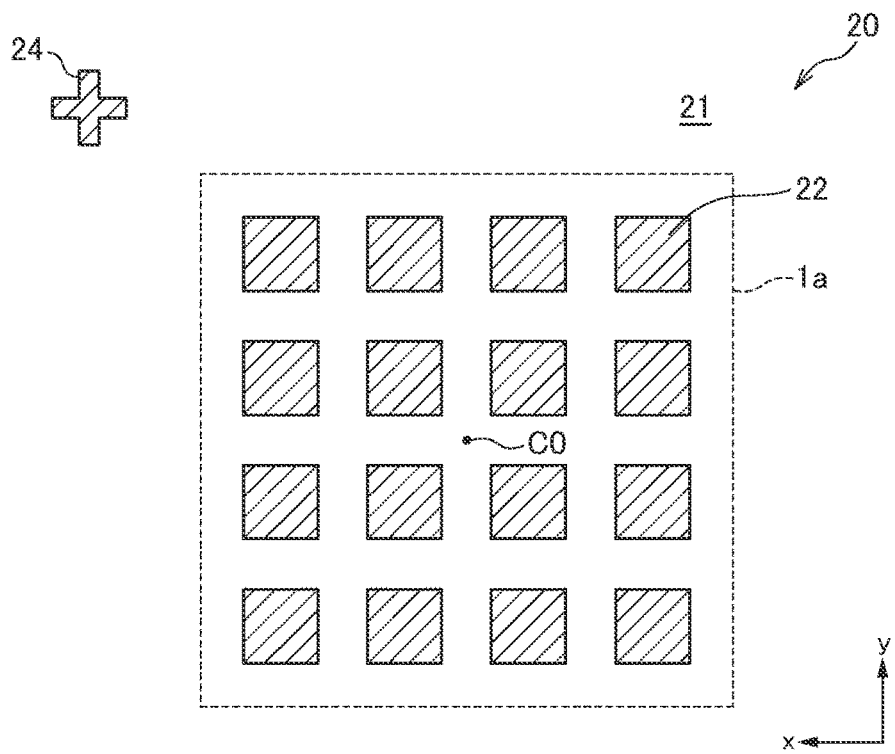
FIG. 3 is a schematic plan view illustrating a part of a surface 21 of a mounting substrate 20 on which the electronic component 1 is to be mounted.

FIG. 3 is a schematic plan view illustrating a part of a surface 21 of a mounting substrate 20 on which the electronic component 1 is to be mounted.

A mounting area 1a for mounting the electronic component 1 is defined in the surface 21 of the mounting substrate 20 illustrated in FIG. 3. The planar position of the mounting area 1a is identified by an alignment mark 24 that is visible from the surface 21 side. A plurality of land patterns 22 for connection to the terminal electrodes 12 of the electronic component 1 are provided in the mounting area 1a. The plurality of land patterns 22 are not offset with respect to the mounting area 1a. Accordingly, the center point of the mounting area 1a and that of the plurality of land patterns 22 are both C0.

Figure 4:
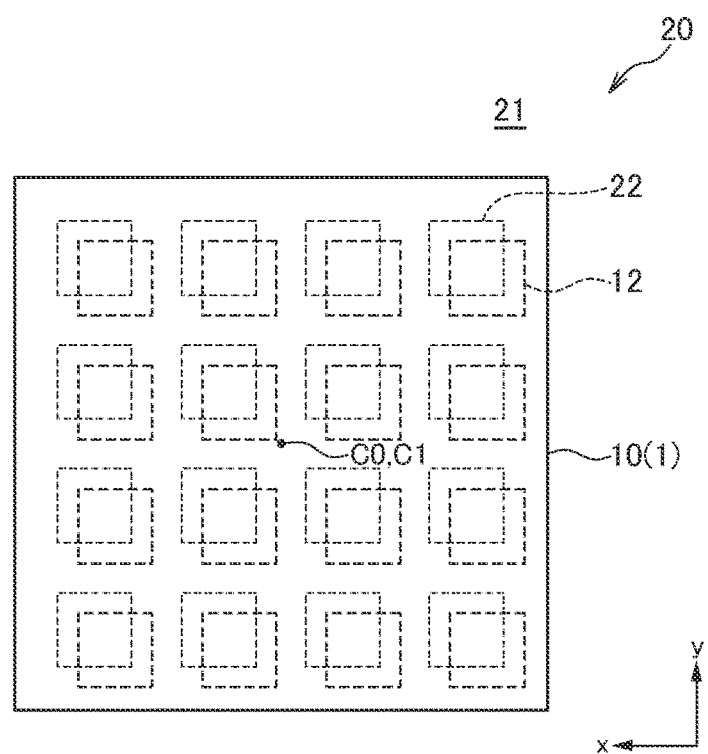
FIG. 4 is a schematic transparent plan view for explaining a state where the electronic component 1 is mounted in the mounting area 1a of the mounting substrate 20.

FIG. 4 is a schematic transparent plan view for explaining a state where the electronic component 1 is mounted in the mounting area 1a of the mounting substrate 20.

When the electronic component 1 is mounted in the mounting area 1a, a solder paste is supplied to the land patterns 22. After that, the electronic component 1 is picked up with a mounter and mounted in the mounting area 1a such that the center points C0 and C1 coincide with each other and that the electronic component 1 and the mounting area 1a coincide with each other in profile. As a result, as illustrated in FIG. 4, a planar displacement corresponding to the offset between the center points C1 and C2 occurs between the planar positions of each land pattern 22 of the mounting substrate 20 and its corresponding terminal electrode 12 of the electronic component 1. That is, the terminal electrode 12 has an area that overlaps its corresponding land pattern 22 and an area that does not overlap the same; similarly, the land pattern 22 has an area that overlaps its corresponding terminal electrode 12 and an area that does not overlap the same. The area where the terminal electrode 12 of the electronic component 1 and the land pattern 22 of the mounting substrate 20 overlap each other is preferably 40% to 90% of the area of the terminal electrode 12 of the electronic component 1. To achieve this, when the outer size of one side of the electronic component 1 is 1 mm to 10 mm, and the size of one side of the terminal electrode 12 is 0.1 mm to 0.6 mm, the offset amount between the center point C1 of the mounting surface 11 of the electronic component 1 and the center point C2 of the terminal formation area A is preferably 0.03 mm to 0.25 mm.

Figure 5A:
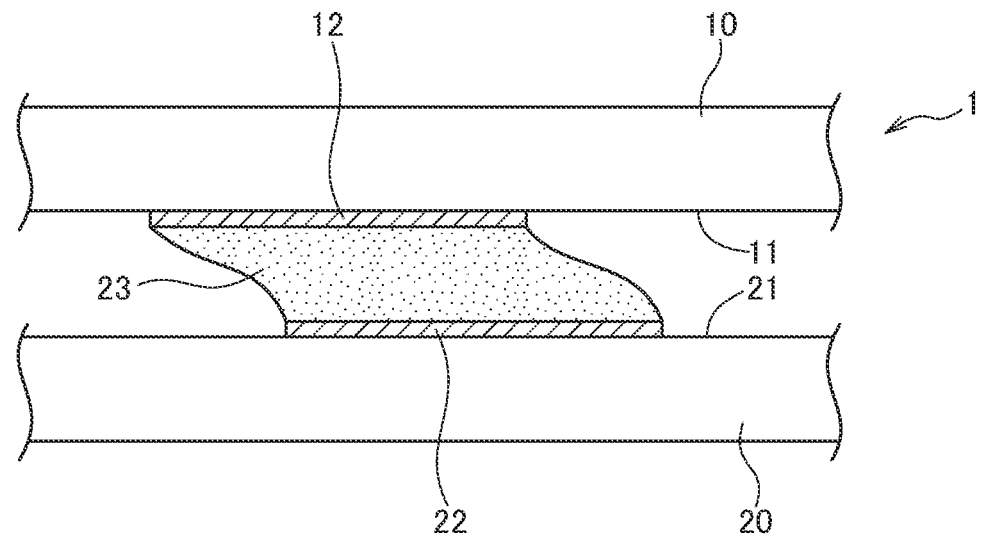
FIG. 5A is a schematic cross-sectional view illustrating a state immediately after the land pattern 22 and the terminal electrode 12 are connected via the solder paste 23.
Figure 5B:
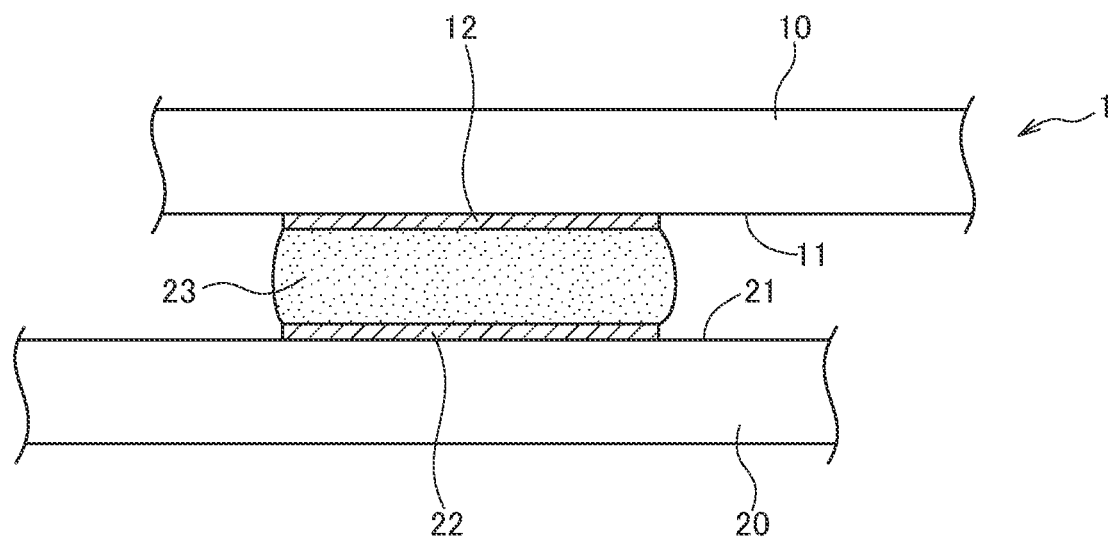
FIG. 5B is a schematic cross-sectional view illustrating a state after reflow.

Thus, when a solder paste 23 is melted by heating, as illustrated in FIG. 5A, the solder paste 23 connecting the land pattern 22 and terminal electrode 12 is elongated in the offset direction and increases in surface area. Then, after cooling, as illustrated in FIG. 5B, the electronic component 1 is self-aligned such that the terminal electrodes 12 are positioned immediately above each corresponding land pattern 12. In the self-aligned state, the land pattern 22 and its corresponding terminal electrode 22 need not completely overlap each other; however, the overlap therebetween increases as compared to at least before the melting of the solder paste 23.

As described above, in the electronic component 1 according to the present embodiment, the center point C2 of the terminal formation area A is offset with respect to the center point C1 of the mounting surface 11. Thus, the surface area of the solder paste 23 increases as illustrated in FIG. 5A immediately after mounting of the electronic component 1 on the mounting substrate 20 and heating, making a void generated inside the solder paste 23 more likely to be released outside. Further, melting of the solder paste 23 causes the electronic component 1 to be self-aligned, and the solder paste 23 flows correspondingly, with the result that a void is more likely to be released outside during which the solder paste 23 flows.

As described above, according to the electronic component 1 of the present embodiment, a void inside the solder is more likely to be released outside even when a lead-free solder having low fluidity is used. In addition, there is no necessity of making a design change with respect to the mounting substrate 20, so that the effect of the present invention can be exhibited even when the electronic component 1 is mounted on an existing mounting substrate 20.

Second Embodiment

Figure 6:
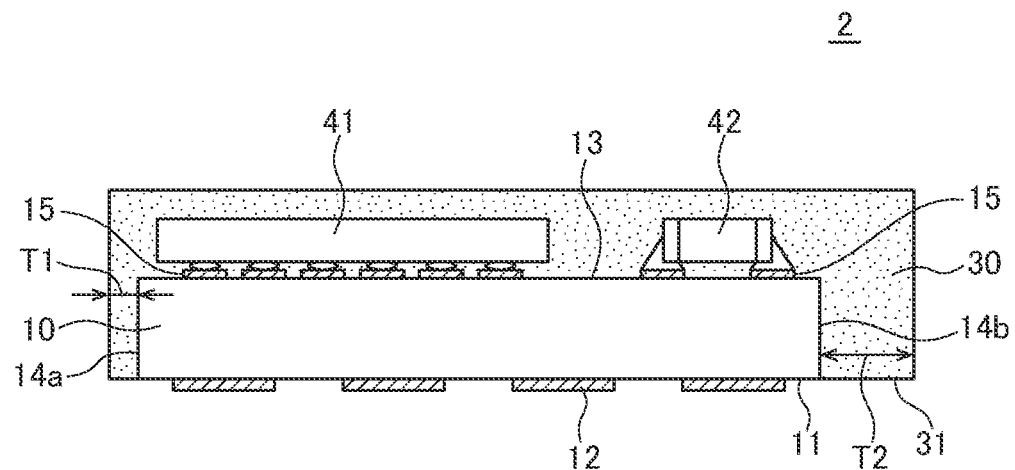
FIG. 6 is a schematic cross-sectional view of an electronic component 2 according to a second embodiment of the present invention.
Figure 7:
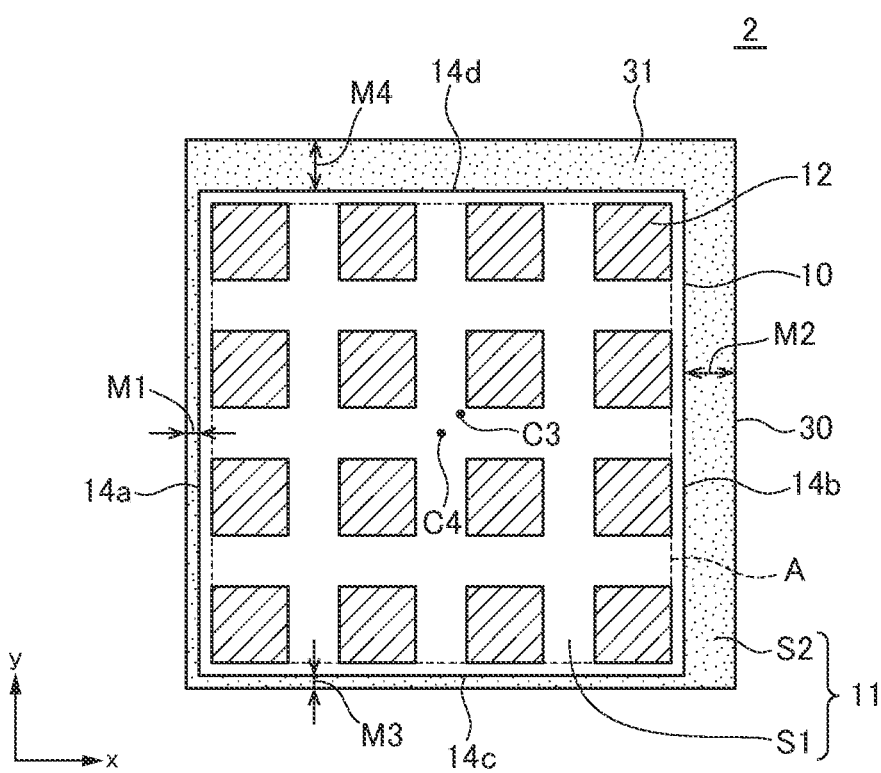
FIG. 7 is a schematic plan view of the electronic component 2 as viewed from the mounting surface side.

FIG. 6 is a schematic cross-sectional view of an electronic component 2 according to a second embodiment of the present invention. FIG. 7 is a schematic plan view of the electronic component 2 as viewed from the mounting surface side.

As illustrated in FIGS. 6 and 7, the electronic component 2 according to the second embodiment differs from the electronic component 1 according to the first embodiment in that a plurality of chip components 41 and 42 are mounted on an upper surface 13 of the chip main body 10 and that the chip main body 10 is molded by a mold member 30 such that the chip components 41 and 42 are covered therewith. The upper surface 13 is a surface facing away from the mounting surface 31 and is parallel thereto. Other configurations are the same as those of the electronic component 1 according to the first embodiment, so the same reference numerals are given to the same elements, and overlapping description will be omitted.

The chip components 41 and 42 mounted on the upper surface 13 of the chip main body 10 are connected to their corresponding terminal electrodes 15 each through a conductive material such as a solder. The chip component is not particularly limited in type. For example, the chip component 41 is a filter circuit or a semiconductor IC, and the chip component 42 is a passive element such a capacitor or an inductor.

The mold member 30 covers not only the upper surface 13 of the chip main body 10 but also side surfaces 14a to 14d thereof perpendicular to the mounting surface 31 and upper surface 13. However, the side surfaces 14a to 14d need not necessarily be strictly perpendicular to the mounting surface 31 and upper surface 13 and only need to be substantially perpendicular. The side surfaces 14a and 14b extend in the y-direction, and the side surfaces 14c and 14d extend in the x-direction. Thus, the mounting surface 31 of the electronic component 2 is constituted by a chip surface S1 of the chip main body 10 and a mold surface S2 of the mold member 30 surrounding the chip main body 10. The chip surface S1 and the mold surface S2 may constitute the same plane.

The thickness of the mold member 30 that covers the side surfaces 14a to 14d of the chip main body 10 is not uniform. As illustrated in FIG. 6, a thickness T2 of the mold member 30 covering the side surface 14b is larger than a thickness T1 of the mold member covering the side surface 14a. Accordingly, assuming that the width of the mold surface S2 positioned at the side surface 14a and that at the side surface 14b are M1 and M2, respectively, M1<M2 is satisfied. The same applies to the mold member 30 on the side covering the side surface 14c and on the side covering the side surface 14d. That is, assuming that the width of the mold surface S2 positioned at the side surface 14c and that at the side surface 14d are M3 and M4, respectively, M3<M4 is satisfied. Thus, even when the terminal formation area A is not offset with respect to the chip surface S1 of the chip main body 10, a center point C4 of the terminal formation area A can be offset with respect to a center point C3 of the entire mounting surface 31 of the electronic component 2 including the mold member 30.

Figure 8:
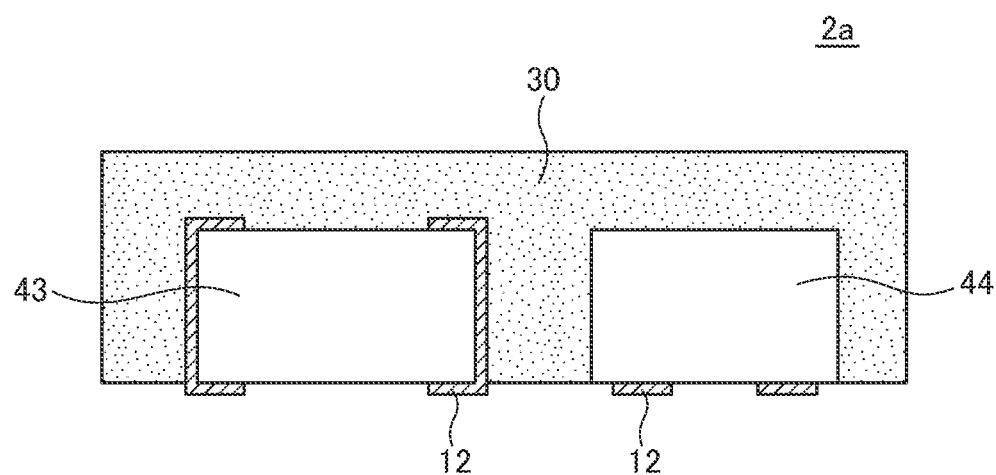
FIG. 8 is a schematic cross-sectional view of an electronic component 2a according to a modification of the second embodiment.

Although the chip components 41 and 42 are mounted on the chip main body 10 in the electronic component 2 illustrated in FIGS. 6 and 7, they need not necessarily be mounted on the chip main body 10. Alternatively, like an electronic component 2a according to a modification illustrated in FIG. 8, a configuration may be employed, in which a plurality of chip components 43 and 44 are collectively molded by the mold member 30, and the terminal electrodes 12 for the chip components 43 and 44 are exposed from the mold member 30. Even with this configuration, the same effect as the electronic component 2 according to the second embodiment can be obtained.

Third Embodiment

Figure 9:
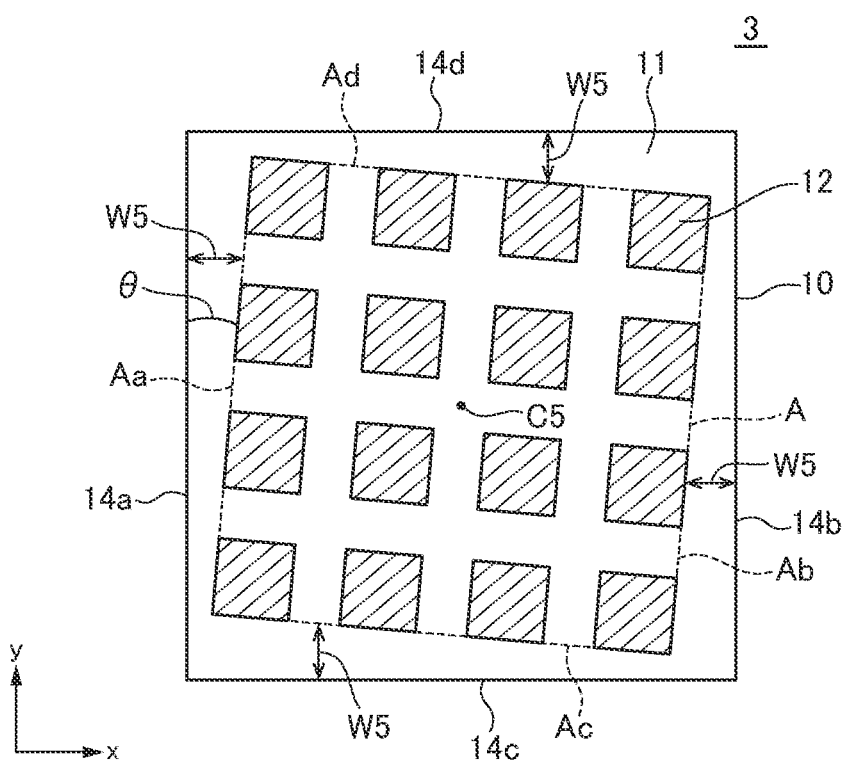
FIG. 9 is a schematic plan view of an electronic component 3 according to a third embodiment as viewed from the mounting surface side.

FIG. 9 is a schematic plan view of an electronic component 3 according to a third embodiment as viewed from the mounting surface side.

As illustrated in FIG. 9, the electronic component 3 according to the third embodiment differs from the electronic component 1 according to the first embodiment in that the edges Aa to Ad defining the terminal formation area A are inclined by a predetermined angle with respect respectively to the edges of the mounting surface 11 constituted by the side surfaces 14a to 14d. Other configurations are the same as those of the electronic component 1 according to the first embodiment, so the same reference numerals are given to the same elements, and overlapping description will be omitted.

The inclination θ of the edges Aa to Ad defining the terminal formation area A is set in a range that does not depart from the scope of the present invention and is desirably about 0.5° to about 7°. Since the edges Aa to Ad each have the inclination θ, a distance W5 between the edge Aa (Ab, Ac, Ad) and the side surface 14a (14b, 14c, 14d) varies along the side surface 14a (14b, 14c, 14d). In the present embodiment, the center point of the mounting surface 11 and the center point of the terminal formation area A are both C5. However, the center point of the mounting surface 11 and the center point of the terminal formation area A need not necessarily coincide with each other.

Figure 10:
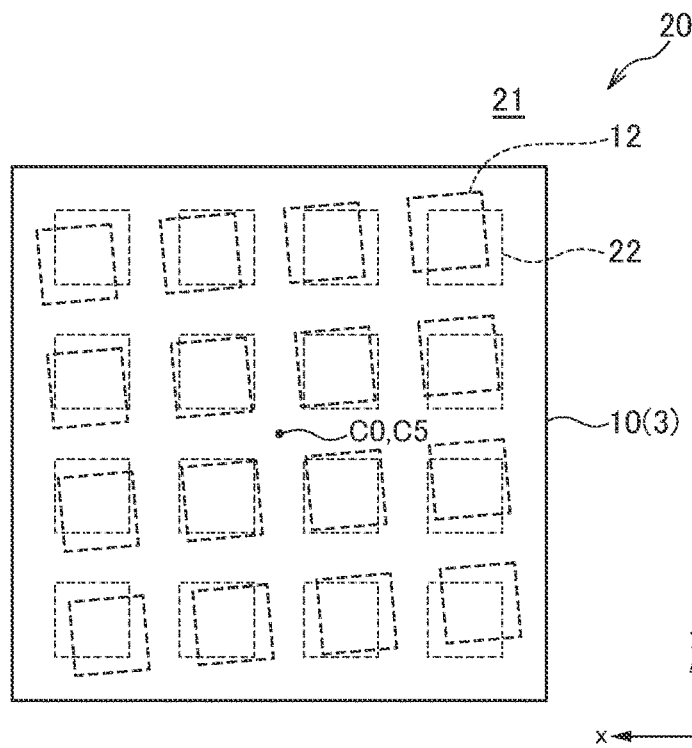
FIG. 10 is a schematic transparent plan view for explaining a state where the electronic component 3 is mounted in the mounting area 1a of the mounting substrate 20.

FIG. 10 is a schematic transparent plan view for explaining a state where the electronic component 3 is mounted in the mounting area 1a of the mounting substrate 20. The configuration of the mounting substrate 20 is as illustrated in FIG. 3, and the center points of the mounting area 1a and plurality of land patterns 22 are both C0. However, the center points of the mounting area 1a and plurality of land patterns 22 need not necessarily coincide with each other.

As illustrated in FIG. 10, when the electronic component 3 is to be mounted in the mounting area 1a, a solder paste is supplied to the land patterns 22. After that, the electronic component 3 is picked up with a mounter and mounted in the mounting area 1a such that the center points C0 and C5 coincide with each other and that the electronic component 3 and mounting area 1a coincide with each other in profile. As a result, as illustrated in FIG. 4, a rotational displacement corresponding to the inclination θ occurs between the planar positions of each land pattern 22 of the mounting substrate 20 and its corresponding terminal electrode 12 of the electronic component 3. Thus, as described using FIGS. 5A and 5B, the surface area of the solder paste 23 increases, and a void inside the solder paste 23 is more likely to be released outside due to the flowing of the solder paste 23 at the time of self-alignment.

Figure 19A:
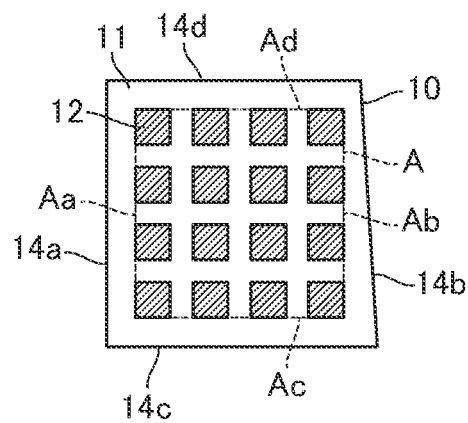
FIGS. 19A to 19F are schematic plan views illustrating various relationships between the edges Aa to Ad and the edges of side surfaces 14a to 14d.
Figure 19B:
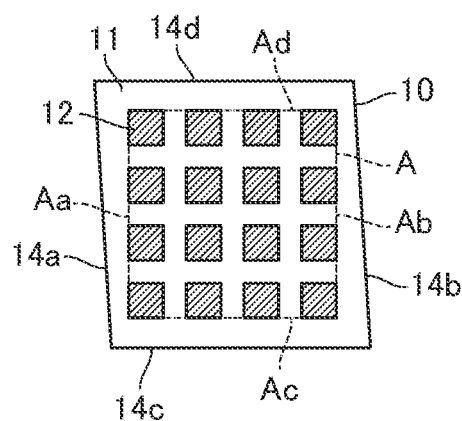
Figure 19C:
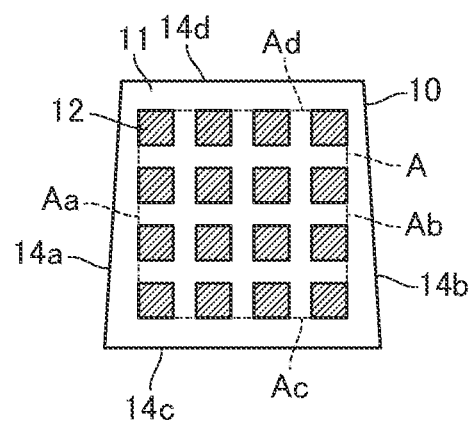
Figure 19D:
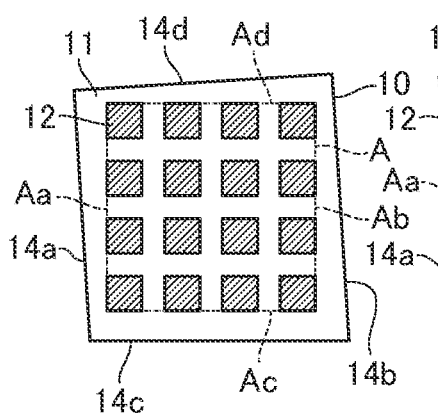
Figure 19E:
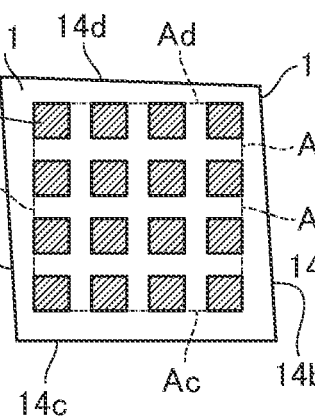
Figure 19F:
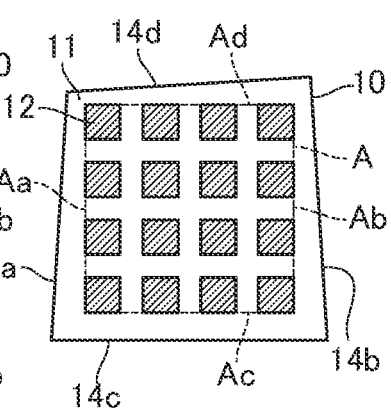

The edges Aa to Ad need not necessarily have the same inclination θ but have different inclinations θ from each other. Further, not all the edges Aa to Ad need to have a predetermined inclination with respect to their corresponding edges of the mounting surface 11, and only some of the edges Aa to Ad may have a predetermined inclination with respect to their corresponding edges. For example, as illustrated in FIG. 19A, the edge Ab and the edge of the side surface 14b may have a predetermined inclination with respect to each other, whereas the other edges Aa, Ac, and Ad may be parallel to the edges of their corresponding side surfaces 14a, 14c, and 14d. That is, only one side may have an inclination. Further, as illustrated in FIGS. 19B and 19C, the edge Aa and side surface 14a, and the edge Ab and side surface 14b may each have a predetermined inclination with respect to each other, whereas the other edges Ac and Ad may be parallel to the edges of their corresponding side surfaces 14c and 14d. That is, only two sides may have an inclination. Further, as illustrated in FIGS. 19D to 19F, the edge Aa and side surface 14a, the edge Ab and side surface 14b, and the edge Ad and side surface 14d may each have a predetermined inclination with respect to each other, whereas the remaining edge Ac may be parallel to the edge of its corresponding side surface 14c. That is, only three sides may have an inclination.

Fourth Embodiment

Figure 11:
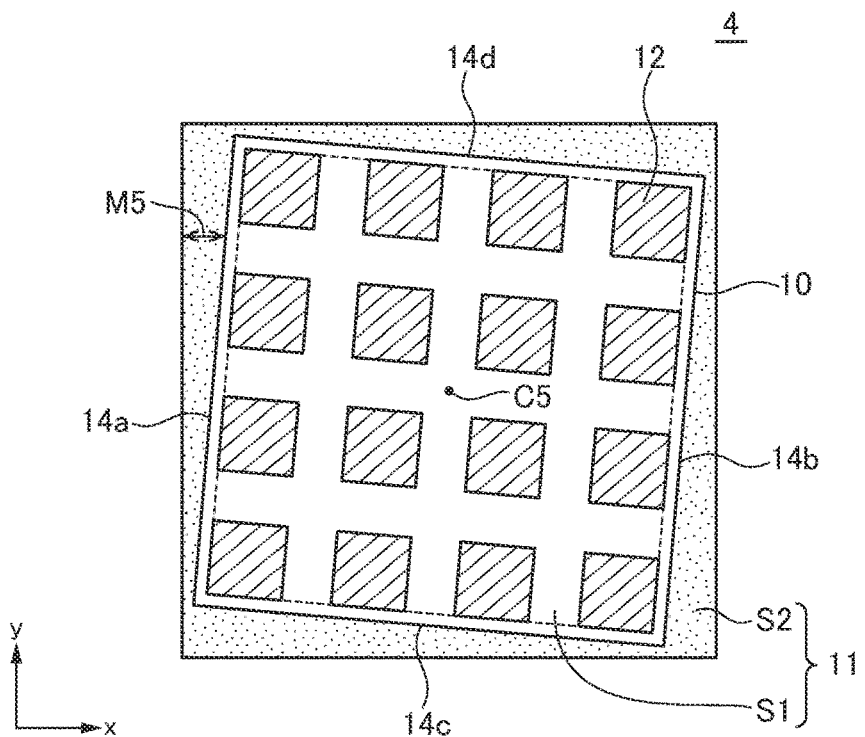
FIG. 11 is a schematic plan view of an electronic component 4 according to a fourth embodiment of the present invention as viewed from the mounting surface side.

FIG. 11 is a schematic plan view of an electronic component 4 according to a fourth embodiment of the present invention as viewed from the mounting surface side.

As illustrated in FIG. 11, the electronic component 4 according to the fourth embodiment differs from the electronic component 3 according to the third embodiment in that, as in the electronic component 2 according to the second embodiment, the side surfaces 14a to 14d of the chip main body 10 are covered with the mold member 30. Other configurations are the same as those of the electronic component 3 according to the third embodiment, so the same reference numerals are given to the same elements, and overlapping description will be omitted.

The mounting surface 11 of the electronic component 4 is constituted by the chip surface S1 of the chip main body 10 and the mold surface S2 of the mold member 30 surrounding the chip main body 10. A width M5 of the mold surface S2 varies along the side surfaces 14a to 14d. In the present embodiment, the center point of the mounting surface 11 and the center point of the terminal formation area A are both C5.

With this configuration, even when the terminal formation area A does not have a rotational displacement with respect to the mounting surface 11 of the chip main body 10, it can be rotated at a desired angle with respect to the entire mounting surface 11 of the electronic component 4 including the mold member 30.

<Manufacturing Method for Electronic Component>

Figure 12:
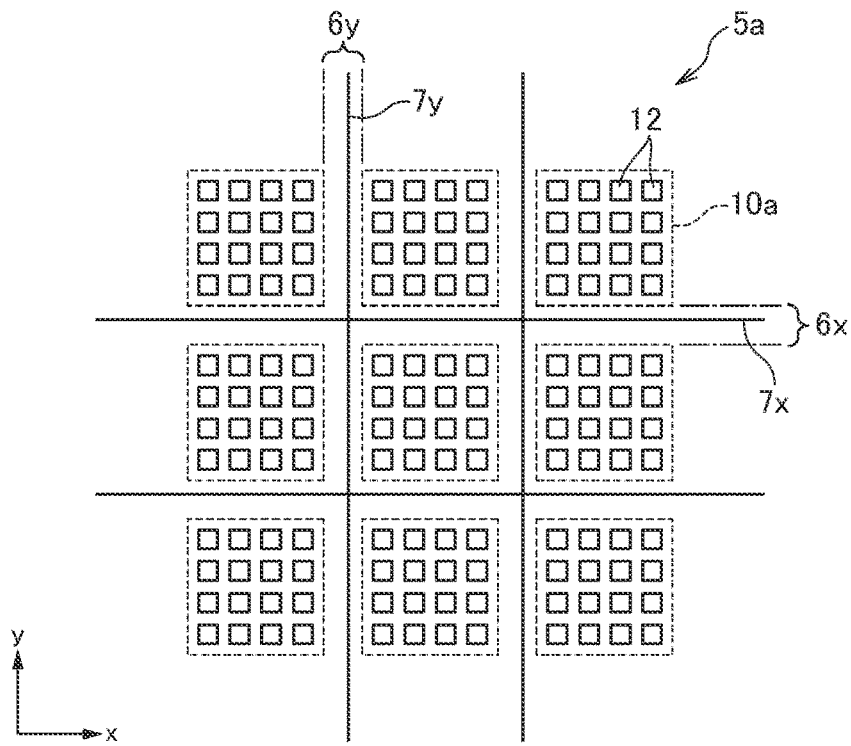
FIG. 12 is a schematic plan view for explaining a manufacturing method for the electronic component 1 according to the first embodiment.

FIG. 12 is a schematic plan view for explaining a manufacturing method for the electronic component 1 according to the first embodiment.

An aggregate substrate 5a illustrated in FIG. 12 is a substrate for obtaining multiple electronic components 1. For this aggregate substrate 5a, dicing areas 6x and 6y are defined avoiding an area 10a where an internal circuit is formed. The dicing area 6x extends in the x-direction, and the dicing area 6y extends in the y-direction. When dicing the aggregate substrate 5a, cutting is made not along the center lines of the respective dicing areas 6x and 6y, but along dicing lines 7x and 7y offset from the center lines, whereby there can be obtained multiple electronic components 1 in each of which the terminal formation area A is offset.

Figure 13:
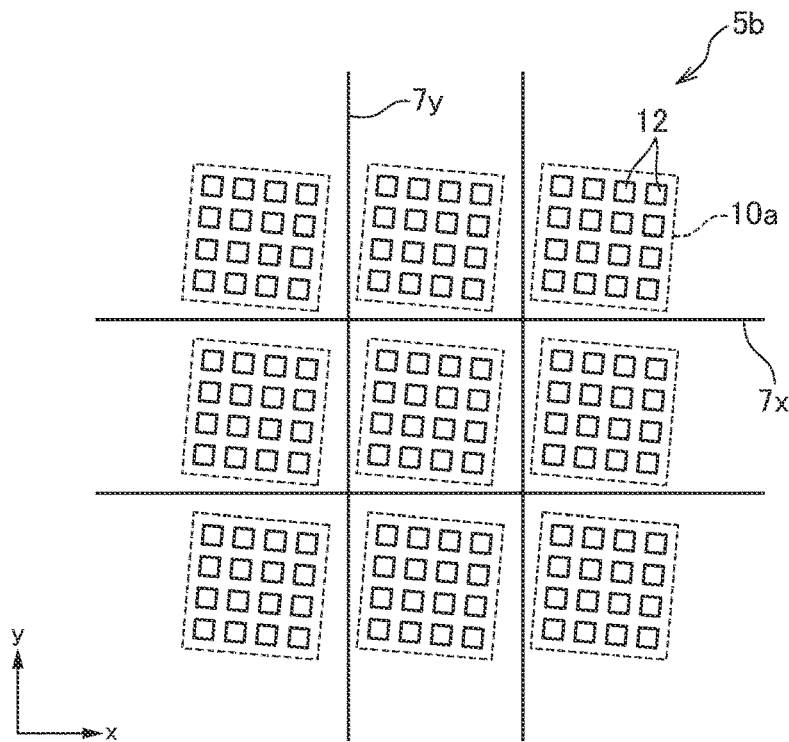
FIG. 13 is a schematic plan view for explaining a manufacturing method for the electronic component 3 according to the third embodiment.

FIG. 13 is a schematic plan view for explaining a manufacturing method for the electronic component 3 according to the third embodiment.

In an aggregate substrate 5b illustrated in FIG. 13, the area 10a where an internal circuit is already formed has an inclination with respect to the dicing lines 7x an 7y. Thus, when the aggregate substrate 5b is cut along the dicing lines 7x extending in the x-direction and dicing line 7y extending in the y-direction, there can be obtained multiple electronic components 3 in each of which the terminal formation area A has a rotational displacement.

Figure 14:
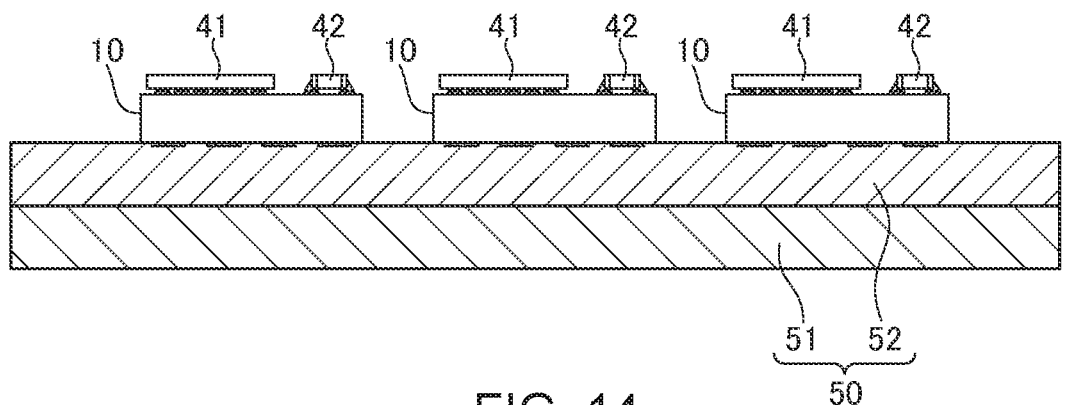
FIGS. 14 to 17 are process views for explaining a manufacturing method for the electronic component 2 according to the second embodiment.
Figure 15:
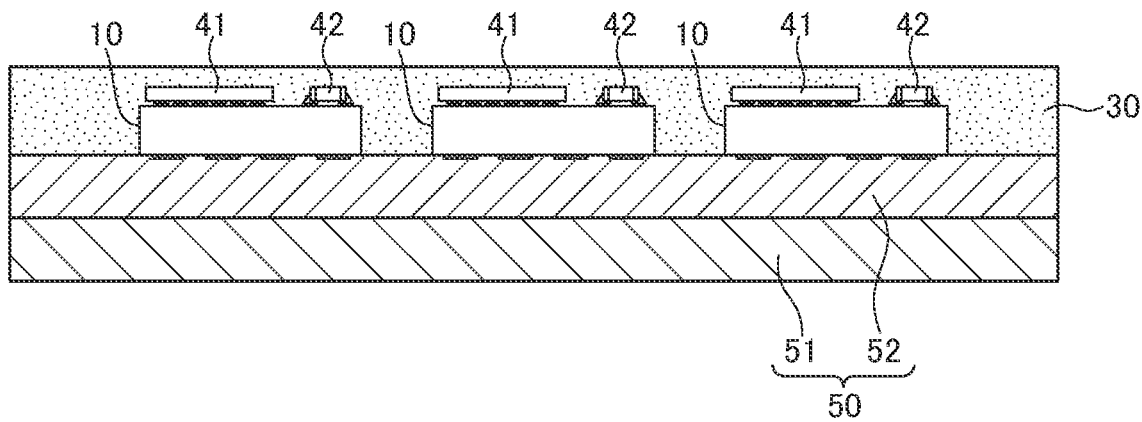
Figure 16:
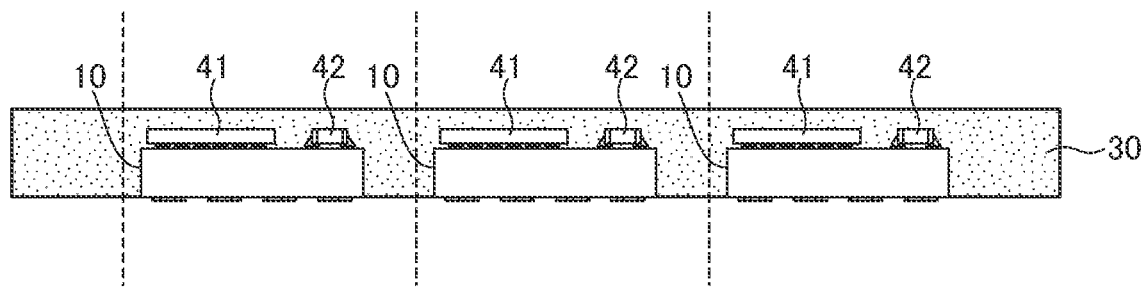

FIGS. 14 to 16 are process views for explaining a manufacturing method for the electronic component 2 according to the second embodiment.

As illustrated in FIG. 14, a plurality of the chip main bodies 10 having the chip components 41 and 42 mounted thereon are prepared, and the mounting surface 11 of each chip main body 10 is stuck to a support 50. In the example of FIG. 14, the support 50 is constituted by a heat proof board 51 and a heat proof double-sided tape 52, and the mounting surface 11 of the chip main body 10 is stuck to the double-sided tape 52.

Then, as illustrated in FIG. 15, the mold member 30 is supplied so as to cover the plurality of chip main bodies 10. The mold member 30 can be supplied by a dispensing method, a print method, a transfer mold method, a compression mold method, or the like. As a result, the chip components 41 and 42 mounted on the upper surface 13 of the chip main body 10 are embedded in the mold member 30, and the mold member 30 is filled between adjacent chip main bodies 10.

Figure 17:
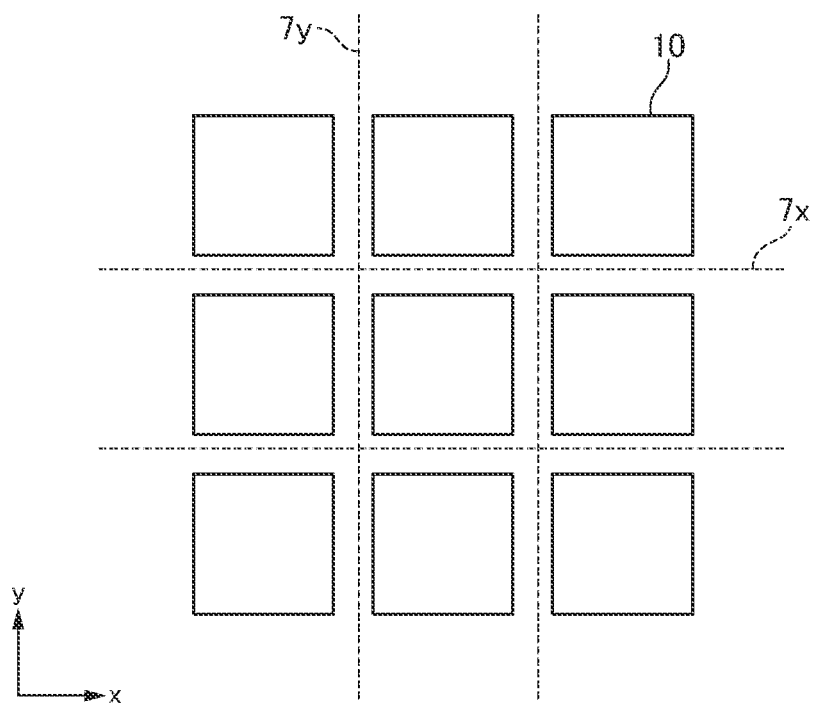

Then, as illustrated in FIG. 16, after removal of the support 50, the mold member 30 is cut for individualization. At this time, the dicing line 7 is offset with respect to the chip main body 10, whereby there can be obtained multiple electronic components 3 in which the terminal formation area A is offset. Alternatively, as illustrated in FIG. 17, when the plurality of chip main bodies 10 are stuck to the support 50, they may be already offset with respect to the dicing line 7, or the planar positions of the plurality of chip main bodies 10 on the support 50 may be displaced using the flowing of the mold member 30.

Figure 18:
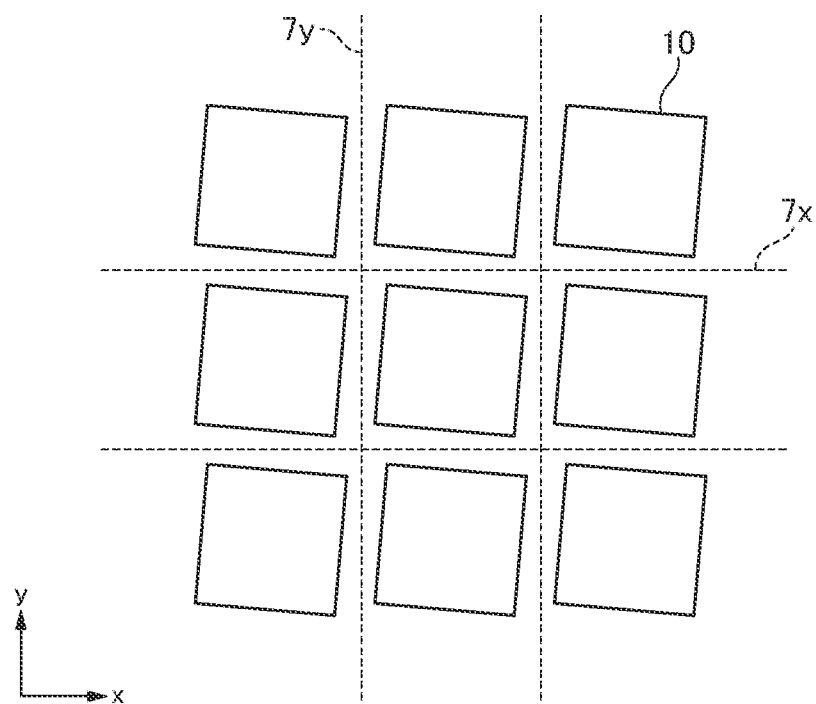
FIG. 18 is a process view for explaining a manufacturing method for the electronic component 4 according to the fourth embodiment.

Further, as illustrated in FIG. 18, the chip main bodies 10 are stuck to the support 50 so as to be inclined at a predetermined angle with respect to the dicing line 7, whereby the electronic component 4 according to the fourth embodiment can be obtained.

As described above, in the electronic components 2 and 4 according to the second and fourth embodiments, the chip main body 10 itself need not have an offset or a rotational displacement, so that it is possible to reduce an increase in manufacturing cost and to desirably adjust an offset amount or a rotational displacement amount.

While the preferred embodiment of the present invention has been described, the present invention is not limited to the above embodiment, and various modifications may be made within the scope of the present invention, and all such modifications are included in the present invention.

What is claimed is:

1. An electronic component comprising:
    a chip main body having a mounting surface extending in a first direction and a second direction perpendicular to the first direction, a first side surface extending in the first direction and a third direction perpendicular to the first and second directions, a second side surface extending in the first and third directions and opposite to the first side surface, a third side surface extending in the second and third directions, and a fourth side surface extending in the second and third directions and opposite to the third side surface;
    a plurality of terminal electrodes arranged in an array in the mounting surface of the chip main body; and
    a mold member having a first part covering the first side surface of the chip main body without covering the mounting surface of the chip main body, a second part covering the second side surface of the chip main body without covering the mounting surface of the chip main body, a third part covering the third side surface of the chip main body without covering the mounting surface of the chip main body, and a fourth part covering the fourth side surface of the chip main body without covering the mounting surface of the chip main body,
    wherein a first width of the first part of the mold member in the second direction is smaller than a second width of the second part of the mold member in the second direction.

2. The electronic component as claimed in claim 1, wherein a third width of the third part of the mold member in the first direction is smaller than a fourth width of the fourth part of the mold member in the first direction.

3. The electronic component as claimed in claim 1, wherein the mounting surface of the chip main body and a bottom surface of the mold member are coplanar with each other.

4. The electronic component as claimed in claim 3,
wherein the chip main body having further has a first edge defining a boundary between the mounting surface and the first side surface, a second edge defining a boundary between the mounting surface and the second side surface, a third edge defining a boundary between the mounting surface and the third side surface, and a fourth edge defining a boundary between the mounting surface and the fourth side surface,
wherein the mounting surface has a terminal formation area positioned between the first and second edges in the second direction and between the third and fourth edges in the first direction,
wherein the terminal formation area is surrounded by a first virtual line extending in the first direction along the first edge of the mounting surface, a second virtual line extending in the first direction along the second edge of the mounting surface, a third virtual line extending in the second direction along the third edge of the mounting surface, and a fourth virtual line extending in the second direction along the fourth edge of the mounting surface, and
wherein the plurality of terminal electrodes include a plurality of first terminal electrodes arranged in the first direction such that outer periphery edges of the plurality of first terminal electrodes are aligned in line along the first virtual line of the terminal formation area, a plurality of second terminal electrodes arranged in the first direction such that outer periphery edges of the plurality of second terminal electrodes are aligned in line along the second virtual line of the terminal formation area, a plurality of third terminal electrodes arranged in the second direction such that outer periphery edges of the plurality of third terminal electrodes are aligned in line along the third virtual line of the terminal formation area, and a plurality of fourth terminal electrodes arranged in the second direction such that outer periphery edges of the plurality of fourth terminal electrodes are aligned in line along the fourth virtual line of the terminal formation area.

5. The electronic component as claimed in claim 4,
wherein a fifth width between the first edge of the mounting surface and the first virtual line of the terminal formation area in the second direction is coincident with a sixth width between the second edge of the mounting surface and the second virtual line of the terminal formation area in the second direction, and
wherein a seventh width between the third edge of the mounting surface and the third virtual line of the terminal formation area in the first direction is coincident with an eighth width between the fourth edge of the mounting surface and the fourth virtual line of the terminal formation area in the first direction.

6. The electronic component as claimed in claim 5, wherein the fifth width is coincident with the seventh width.

7. The electronic component as claimed in claim 4, wherein the plurality of terminal electrodes further include a plurality of fifth terminal electrodes arranged between the plurality of first terminal electrodes and the plurality of second terminal electrodes in the second direction and between the plurality of third terminal electrodes and the plurality of fourth terminal electrodes in the first direction.

8. The electronic component as claimed in claim 7, wherein the plurality of fifth terminal electrodes are arranged in an array.

9. The electronic component as claimed in claim 4,
wherein the plurality of first terminal electrodes are arranged in a first pitch,
wherein the plurality of second terminal electrodes are arranged in a second pitch,
wherein the plurality of third terminal electrodes are arranged in a third pitch,
wherein the plurality of fourth terminal electrodes are arranged in a fourth pitch,
wherein the first pitch is coincident with the second pitch, and
wherein the third pitch is coincident with the fourth pitch.

10. The electronic component as claimed in claim 9, wherein the first pitch is coincident with the third pitch.

11. A method for manufacturing an electronic component, the method comprising:
sticking a plurality of chip main bodies to a support such that a mounting surface of each of the plurality of chip main bodies is adhered to the support, wherein the plurality of chip main body include a first chip main body, a second chip main body, and a third chip main body arranged between the first and second chip main bodies in a first direction;
supplying a mold member to the support so as to embed the plurality of chip main bodies therein;
removing the support so as to expose the mounting surface of each of the plurality of chip main bodies; and
a first dicing the mold member along a first dicing line extending in a second direction perpendicular to the first direction between the first and third chip main bodies and a second dicing line extending in the second direction between the second and third chip main bodies,
wherein a distance between the first dicing line and the third chip main body in the first direction is smaller than a distance between the first dicing line and the first chip main body in the first direction, and
wherein a distance between the second dicing line and the third chip main body in the first direction is greater than a distance between the second dicing line and the second chip main body in the first direction.

12. The method for manufacturing an electronic component as claimed in claim 11, wherein the distance between the first dicing line and the third chip main body in the first direction is smaller than the distance between the second dicing line and the third chip main body in the first direction.

13. The method for manufacturing an electronic component as claimed in claim 12,
wherein the plurality of chip main body further include fourth and fifth main bodies,
wherein the third chip main body is arranged between the fourth and fifth chip main bodies in the second direction,
wherein the method further comprises a second dicing the mold member along a third dicing line extending in the first direction between the third and fourth chip main bodies and a fourth dicing line extending in the first direction between the third and fifth chip main bodies,
wherein a distance between the third dicing line and the third chip main body in the second direction is smaller than a distance between the third dicing line and the fourth chip main body in the second direction, and
wherein a distance between the fourth dicing line and the third chip main body in the second direction is greater than a distance between the fourth dicing line and the fifth chip main body in the second direction.

14. The method for manufacturing an electronic component as claimed in claim 13, wherein the distance between the third dicing line and the third chip main body in the second direction is smaller than the distance between the fourth dicing line and the third chip main body in the second direction.

* * * * *